(12) United States Patent
Lee et al.

(10) Patent No.: US 12,507,470 B2
(45) Date of Patent: Dec. 23, 2025

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Hsin-Yi Lee, Hsinchu (TW); Cheng-Lung Hung, Hsinchu (TW); Weng Chang, Hsin-Chu (TW); Chi-On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 373 days.

(21) Appl. No.: 18/190,908

(22) Filed: Mar. 27, 2023

(65) Prior Publication Data
US 2023/0230977 A1 Jul. 20, 2023

Related U.S. Application Data

(63) Continuation of application No. 16/676,443, filed on Nov. 7, 2019, now Pat. No. 11,646,311.

(60) Provisional application No. 62/904,651, filed on Sep. 23, 2019.

(51) Int. Cl.
*H10D 84/83* (2025.01)
*H10D 84/01* (2025.01)
*H10D 84/03* (2025.01)

(52) U.S. Cl.
CPC ......... *H10D 84/834* (2025.01); *H10D 84/014* (2025.01); *H10D 84/0158* (2025.01); *H10D 84/038* (2025.01)

(58) Field of Classification Search
CPC ............... H10D 84/834; H10D 84/014; H10D 84/0158; H10D 84/038
See application file for complete search history.

(56) References Cited

U.S. PATENT DOCUMENTS

| | | | | |
|---|---|---|---|---|
| 9,748,145 | B1* | 8/2017 | Kannan | H10D 84/038 |
| 9,780,183 | B2* | 10/2017 | Kim | H10D 84/014 |
| 10,109,630 | B2* | 10/2018 | Gan | H10D 84/014 |
| 10,784,260 | B2* | 9/2020 | Park | H10D 30/6735 |
| 2013/0217220 | A1* | 8/2013 | Jagannathan | H10D 84/0193 257/E21.19 |
| 2016/0053385 | A1* | 2/2016 | Muro | H01L 21/32134 438/669 |
| 2020/0013897 | A1* | 1/2020 | Park | H10D 64/689 |

* cited by examiner

Primary Examiner — Benjamin Tzu-Hung Liu
(74) Attorney, Agent, or Firm — JCIPRNET (57) ABSTRACT

A semiconductor device including a substrate, a first transistor and a second transistor is provided. The first transistor includes a first gate structure over the first semiconductor fin. The first gate structure includes a first high-k layer and a first work function layer sequentially disposed on the substrate, a material of the first work function layer may include metal carbide and aluminum, and a content of aluminum in the first work function layer is less than 10% atm. The second transistor includes a second gate structure. The second gate structure includes a second high-k layer and a second work function layer sequentially disposed on the substrate. A work function of the first work function layer is greater than a work function of the second work function layer.

20 Claims, 10 Drawing Sheets

SEMICONDUCTOR DEVICE AND METHOD OF FABRICATING THE SAME

CROSS-REFERENCE TO RELATED APPLICATION

This is a continuation application of and claims the priority benefit of a prior application Ser. No. 16/676,443 filed on Nov. 7, 2019, now allowed, which claims the priority benefit of U.S. provisional application Ser. No. 62/904,651, filed on Sep. 23, 2019. The entirety of the above-mentioned patent application is hereby incorporated by reference herein and made a part of this specification.

BACKGROUND

A semiconductor device may require multiple components with different device characteristics. For example, the component for computational logic functions may require increased switching speed, and the component for memory storage functions may require decreased power consumption. Therefore, the design of the semiconductor device becomes complicate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (a-gate) devices, or Pi-gate (H-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure. For example, some embodiments as described herein may also be applied to the formation of contacts, vias, or interconnects.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 1:
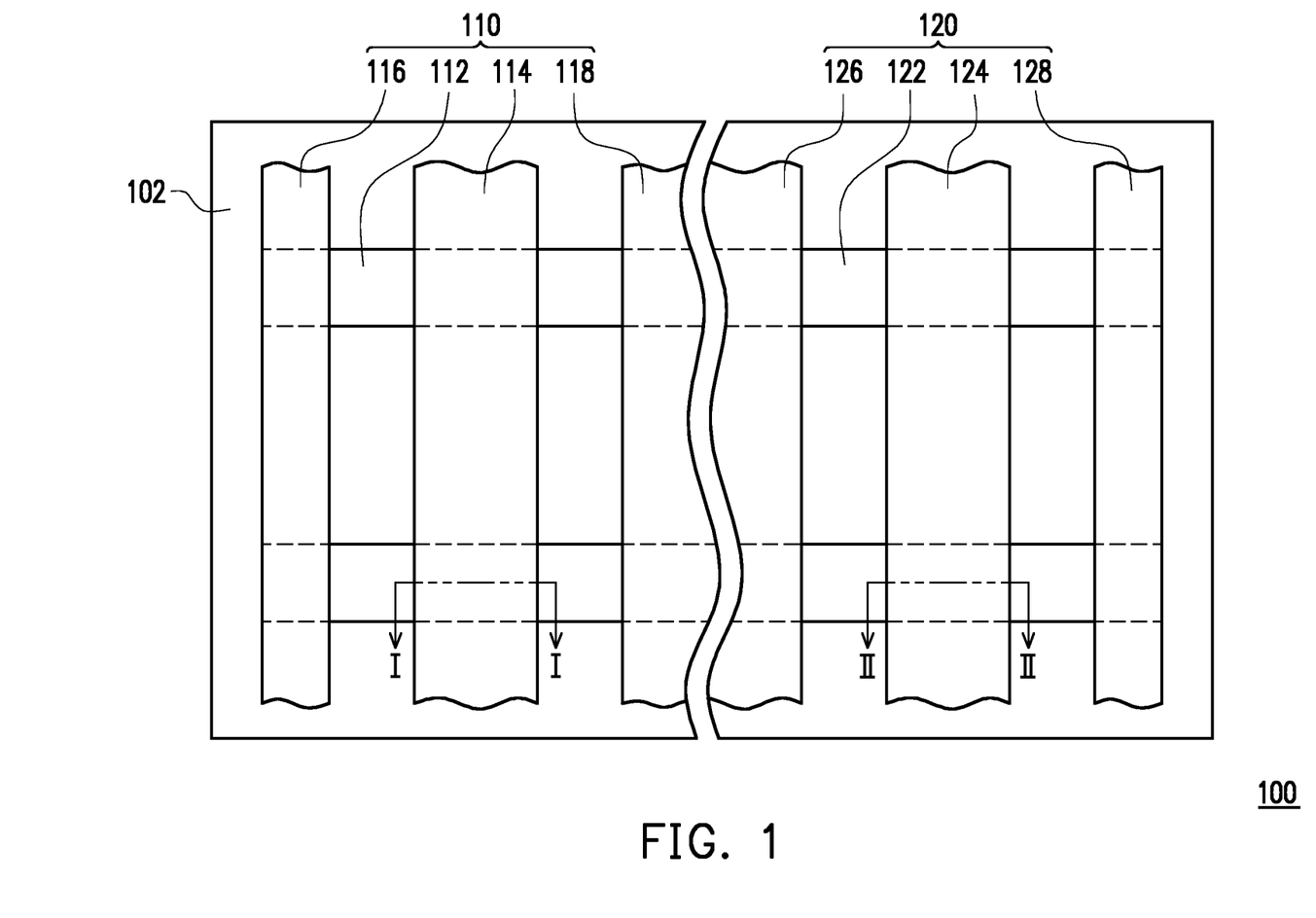
FIG. 1 schematically illustrates a plan view of a semiconductor device in accordance with some embodiments.

FIG. 1 schematically illustrates a plan view of a semiconductor device in accordance with some embodiments. Referring to FIG. 1, a semiconductor device 100 may include a substrate 102, a first transistor 110, and a second transistor 120. The first transistor 110 and the second transistor 120 are disposed on the substrate 102. In some embodiments, the semiconductor device 100 may be an integrated circuit device typically provided in chip form and may be encapsulated in a package. The semiconductor device 100 may include more than two transistors while the first transistor 110 and the second transistor 120 are illustrated as examples without the intention of limiting the numbers of the transistors in the semiconductor device 100. In the semiconductor device 100, thousands, or more, transistors may be interconnected. In some embodiments, the first transistor 110 and the second transistor 120 may have different device characteristics and thus be able to provide various functions. For example, the first transistor 110 and the second transistor 120 may each be p-type transistor or n-type transistor. In accordance with some embodiments, one or more n-type transistor in the semiconductor device 100 may be interconnected with one or more p-type transistor, for example, by sharing a common gate structure, or may be connected by metal contacts (not shown).

The substrate 102 may be a bulk semiconductor substrate such as a bulk silicon wafer. The term "substrate" may be used to refer to just the semiconductor substrate or a semiconductor substrate inclusive of isolation regions. The substrate 102 may be or include any silicon-containing substrate including, but not limited to, single crystal Si, polycrystalline Si, amorphous Si, or Si-on-insulator (SOI) substrates and the like, and may be n-type or p-type doped as desired for a particular application. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer). The substrate 102 may have one or more fin structures for constructing the transistors such as the first transistor 110 and the second transistor 120. The first transistor 110 and the second transistor 120 may be fin type field effect transistors (Fin FETs).

The first transistor 110 may include a first semiconductor fin 112, a first gate structure 114, a first source 116 and a first drain 118. In some embodiments, the first transistor 110 may include two or more first semiconductor fins 112 and each of the first semiconductor fins 112 may be a linear structure. The first semiconductor fins 112 may be located between neighboring isolation regions in the substrate 102 in some embodiments. The first gate structure 114 is disposed over the first semiconductor fins 112. The first gate structure 114 may extend in a direction intersecting the extending direction of each of the first semiconductor fins 112 and cross through the first semiconductor fins 112. The first source 116 and the first drain 118 are located at two opposite sides of the first gate structure 114, and the first semiconductor fins 112 connect between the first source 116 and the first drain 118.

The second transistor 120 may have a similar top view structure to the first transistor 110. The second transistor 120 may include a second semiconductor fin 122, a second gate structure 124, a second source 126, and a second drain 128. In some embodiments, the second transistor 120 may include two or more second semiconductor fins 122 and each of the second semiconductor fins 122 may be a linear structure on the substrate 102. The second gate structure 124 is disposed over the second semiconductor fins 122. The second gate structure 124 may extend in a direction intersecting the extending direction of each of the second semiconductor fins 122 and cross through the second semiconductor fins 122. The second source 126 and the second drain 128 are located at two opposite sides of the second gate structure 124, and the second semiconductor fins 122 connect between the second source 126 and the second drain 128.

Figure 2:
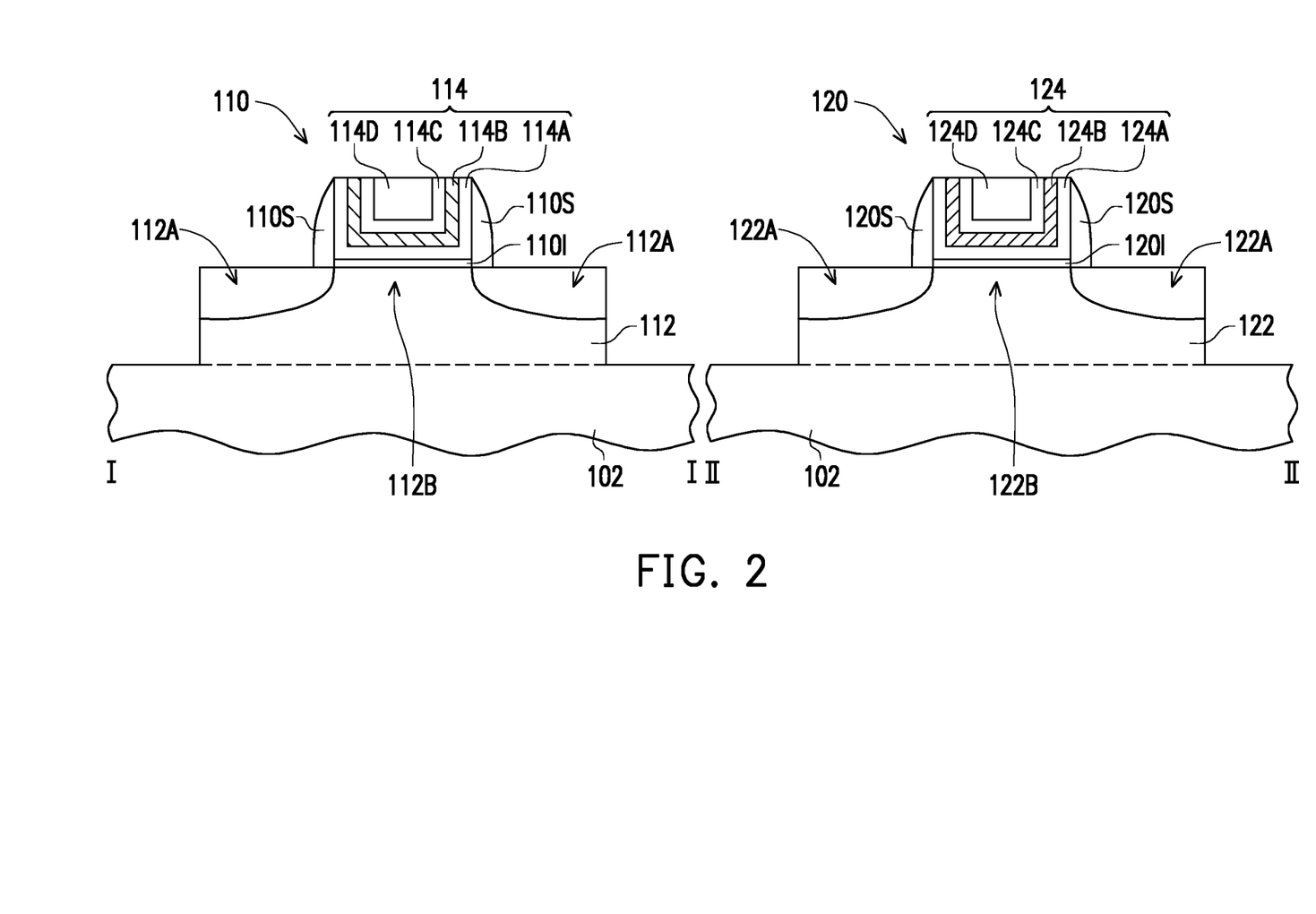
FIG. 2 schematically illustrates a cross-sectional view of a semiconductor device taken along lines I-I and II-II in FIG. 1.

FIG. 2 schematically illustrates a cross-sectional view of a semiconductor device taken along lines I-I and II-II in FIG. 1. Referring to FIG. 2, the first semiconductor fin 112 and the second semiconductor fin 122 may be protruded structures on the substrate 102. A spacer 110S and a spacer 120S may be further disposed on the substrate 102. The spacer 110S and the spacer 120S may be made of silicon nitride, SiCN, a combination thereof, or the like, and may include a plurality of layers. The spacer 110S is disposed on the first semiconductor fin 112 to define a recess structure on the substrate 102 with the first semiconductor fin 112 and the first gate structure 114 is disposed in the recess structure defined by the spacer 110S. The first gate structure 114 may be surrounded by the spacer 110S. Similarly, the spacer 120S may define a recess structure on the second semiconductor fin 122 and the second gate structure 124 may be surrounded by the spacer 120S.

In some embodiments, the first semiconductor fin 112 may have two doped regions 112A located at opposite sides of a channel region 112B and the second semiconductor fin 122 may have two doped regions 122A located at opposite sides of a channel region 122B. The first gate structure 114 is located above the channel region 112B and the second gate structure 124 is located above the channel region 122B. In some embodiments, the doped regions 112A and the doped regions 122A may include p-type dopant material such as boron, aluminum, gallium, indium, or the like, or n-type dopant material such as phosphorus, arsenic, antimony, bismuth, lithium or the like. In some embodiments, lightly doped source/drain (LDD) regions (not shown) may be respectively disposed between the channel region 112B and the doped regions 112A and between the channel region 122B and the doped regions 122A, while the LDD regions may have a dopant concentration less that the doped regions 112A and 122A. In some embodiments, the dopant material of the doped region 112A and the dopant material of the doped region 122A may be different. In some embodiments, one of the first transistor 110 and the second transistor 120 may be p-type transistor and the other one may be n-type transistor corresponding to the types of the dopant materials in the doped regions 112A and 122A. Or, the first transistor 110 and the second transistor 120 may both be the same type transistors with different threshold voltages.

In the first transistor 110, an insulating layer 110I is disposed on the channel region 112B between the first semiconductor fin 112 and the first gate structure 114, and the insulating layer 110I may extend in the bottom of the recess structure defined by the spacer 110S. The insulating layer 110I may be, for example, silicon oxide, silicon nitride, silicon oxynitride, a combination thereof, or the like, and may be deposited or thermally grown on the first semiconductor fin 112 according to acceptable techniques.

The first gate structure 114 is disposed on the insulating layer 110I and surrounded by the spacer 110S. The first gate structure 114 may include a first high-k layer 114A, a first work function layer 114B, a first glue layer 114C and a first gate fill material 114D. The first high-k layer 114A, the first work function layer 114B and the first glue layer 114C may be sequentially deposited on the insulating layer 110I. Each of the first high-k layer 114A, the first work function layer 114B and the first glue layer 114C may be deposited by using physical vapor deposition (PVD), atomic layer deposition (ALD), chemical vapor deposition (CVD), sputtering, or other known processes, depending on the material composition of the layer. Each of the first high-k layer 114A, the first work function layer 114B and the first glue layer 114C may conformally cover the corresponding underlying layer. The first high-k layer 114A, the first work function layer 114B and the first glue layer 114C may define a recess structure and the first gate fill material 114D may fill the recess structure by using physical vapor deposition (PVD), Molecular-Beam Deposition (MBD), atomic layer deposition (ALD), chemical vapor deposition (CVD), sputtering, or other known processes.

Similarly, in the second transistor 120, an insulating layer 120I is disposed on the channel region 122B between the second semiconductor fin 122 and the second gate structure 124. The insulating layer 120I may be made of, for example, silicon oxide, silicon nitride, a combination thereof, or the like, and may be deposited or thermally grown on the second semiconductor fin 122 according to acceptable techniques.

The second gate structure 124 is disposed on the insulating layer 120I and surrounded by the spacer 120S. The second gate structure 124 may include a second high-k layer 124A, a second work function layer 124B, a second glue layer 124C and a second gate fill material 124D. The second high-k layer 124A, the second work function layer 124B and the second glue layer 124C may be sequentially deposited on the insulating layer 120I. Each of the second high-k layer 124A, the second work function layer 124B and the second glue layer 124C may be deposited by using physical vapor deposition (PVD), Molecular-Beam Deposition (MBD), atomic layer deposition (ALD), chemical vapor deposition (CVD), sputtering, or other known processes, depending on the material composition of the layer. Each of the second high-k layer 124A, the second work function layer 124B and the second glue layer 124C may conformally cover the corresponding underlying layer. The second high-k layer 124A, the second work function layer 124B and the second glue layer 124C may define a recess structure and the second gate fill material 124D may fill the recess structure.

In some embodiments, the first high-k layer 114A and the second high-k layer 124A are formed by a common high-k material layer. The formation methods of the common high-k material layer may include Molecular-Beam Deposition (MBD), ALD, PECVD, and the like. The common high-k material layer may have a dielectric constant greater than, for example, about 3.9 (the dielectric constant of silicon dioxide) or greater than about 7.0, and be made of, but not limited to, a metal oxide or a silicate of Hf, Al, Zr, La, Mg, Ba, Ti, Pb, and combinations thereof. Alternatively, the common high-k material layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some embodiments, one or more capping layer may be disposed on the common high-k material layer to protect the first high-k layer 114A and the second high-k layer 124A from damage during subsequent processing steps. The material of the capping layer may include titanium nitride (TiN) or tantalum nitride (TaN).

The material of the first work function layer 114B may include Ti, Al and C. In some embodiments, the material of the first work function layer 114B may be metal carbide, for example, titanium carbide (TiC). In some embodiments, the first work function layer 114B may be formed in an atomic layer deposition (ALD) chamber. For example, the first work function layer 114B may be formed by depositing a material of the first work function layer 114B on the first high-k layer 114A by using a first precursor and a second precursor. The first precursor may include metal chloride, and the second precursor may include tri-methyl-aluminum (TMA). The first precursor such as $TiCl_4$ and the second precursor such as TMA may by supplied into the ALD chamber that may operable to deposit the material of the first work function layer 114B under a temperature of about 250° C. to about 600° C. and a pressure of about 0.5 torr to about 40 torr, but not limited thereto. In some embodiments, the material of the first work function layer 114B may be deposited at a temperature ranged from about 300° C. to about 500° C. and Al in the deposited first work function layer 114B may be less than 10% atm. The first precursor may be supplied into the ALD chamber in a pulse time of about 0.1 seconds to about 30 minutes and a flow rate of about 500 sccm to about 9,000 sccm. The second precursor may be supplied into the ALD chamber in a pulse time of 0.1 seconds to 30 minutes and a flow rate of 500 sccm to 9,000 sccm. However, the above temperature, pressure, pulse time and flow rate may be adjusted based on the types of the material and the required deposited layer. In some embodiments, the deposited material by using $TiCl_4$ and TMA as the precursors may include TiC with additional material selected from at least one of Al, O and Cl. Thus, the material of the first work function layer 114B may include TiC and additional material selected from at least one of Al, O and Cl. In some embodiments, the material of the first work function layer 114B may include aluminum with a content of less than 10% atm. The first work function layer 114B may have a work function, similar to TiN or Ti—Si—N, for example, about 4.9 ev and serve as a p-type work function layer in some embodiments, but is not limited thereto. In some embodiments, the content of Al in the first work function layer 114B may be different under different deposition conditions, for example, temperature and the work function of the first work function layer 114B may be determined based on the content of Al. Accordingly, the first work function layer 114B may be applied to the transistors having various threshold voltages.

The material of the second work function layer 124B is different from the first work function layer 114B. For example, a material of the second work function layer 124B may include metal or metal carbide. A material of the second work function layer 124B may be at least one selected from TiAl, TiAlC, TaC, TaAlC, NbC, and VC. In some embodiments, a material of the second work function layer 124B may include aluminum with a content of more than 10% atm. The work function of the first work function layer 114B may be greater than the work function of the second work function layer 124B. In some embodiments, the second work function layer 124B may serve as an n-type work function layer.

In the method of manufacturing the semiconductor device 100, the material of the first work function layer 114B and the material of the second work function layer 124B may be deposited alternately on the common high-k material layer forming the first high-k layer 114A and the second high-k layer 124A. For example, the material of the first work function layer 114B may be firstly deposited on the common high-k material layer forming the first high-k layer 114A and the second high-k layer 124A. A portion of the material of the first work function layer 114B that covers the recess structure defined by the second semiconductor fin 122 and the spacer 120S may be removed by a patterning process. Subsequently, the material of the second work function layer 124B may be deposited to cover the U-shape structure defined by the second semiconductor fin 122 and the spacer 120S. In some embodiments, a portion of the material of the second work function layer 124B may cover the first work function layer 114B and may be removed based on various device designs.

A common glue layer forming the first glue layer 114C and the second glue layer 124C may be formed to cover the first work function layer 114B and the second work function layer 124B. The material of the first glue layer 114C and the second glue layer 124C may include TiN or similar material. The first glue layer 114C and the second glue layer 124C may conformally cover the first work function layer 114B and the second work function layer 124B to define respective recess structures and a gate fill material such as W, TiN, TaN, WN, Re, Ir, Ru, Mo, Al, Cu, Co, Ni, combinations thereof, and/or other suitable compositions may be deposited in the respective recess structures to form the first gate fill material 114D and the second gate fill material 124D. Subsequent to filling gate fill material, a planarization process such as chemical mechanical polishing (CMP) process may be performed to remove extra material to form the first gate structure 114 and the second gate structure 124. The first high-k layer 114A, the first work function layer 114B, the first glue layer 114C and the first gate fill material 114D may construct a common top surface with the spacer 110S.

The second high-k layer 124A, the 124, the second glue layer 124C and the second gate fill material 124D may construct a common top surface with the spacer 120S.

Figure 3:
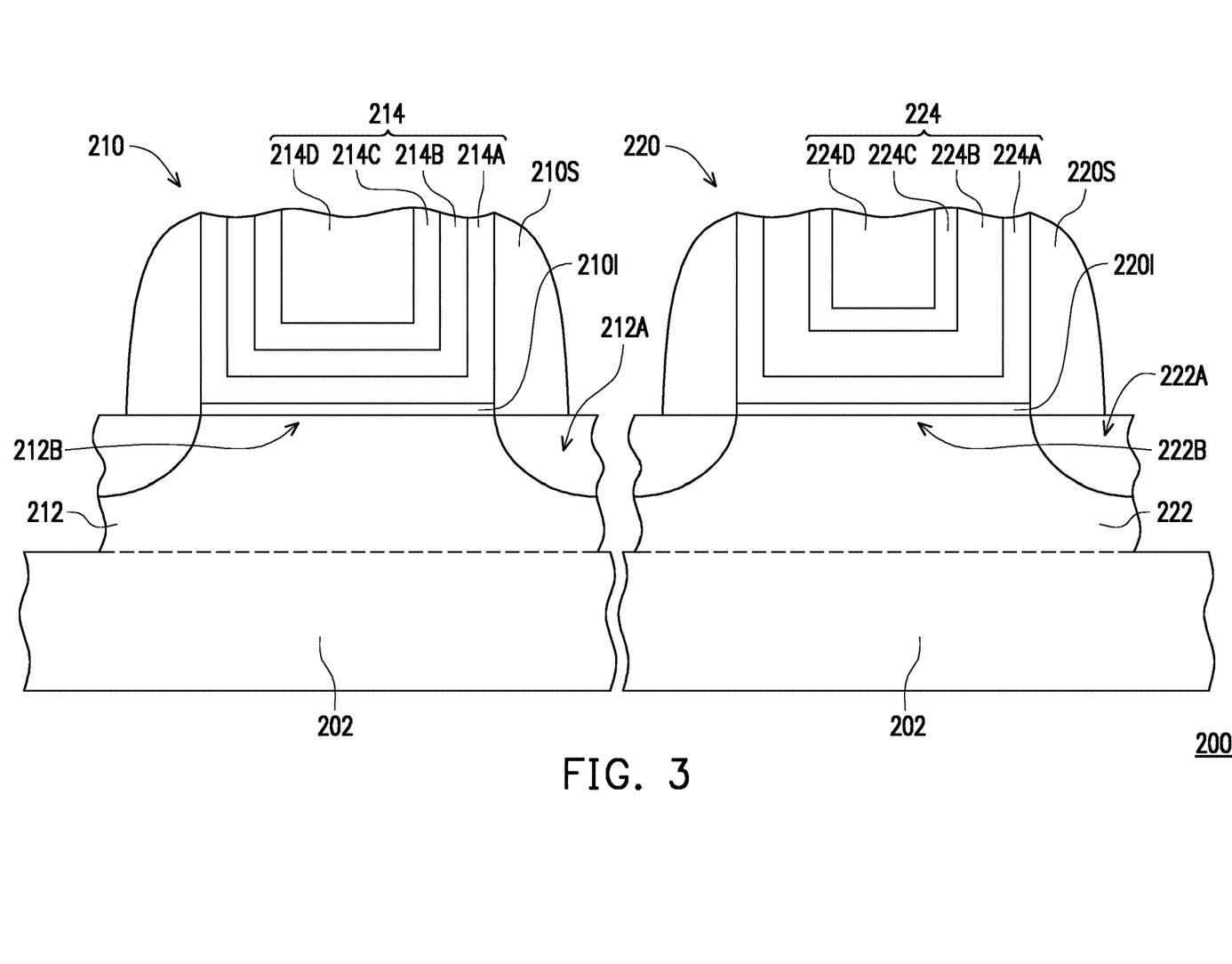
FIG. 3 schematically illustrates a cross sectional view of a portion of a semiconductor device in accordance with some embodiments.

FIG. 3 schematically illustrates a cross sectional view of a portion of a semiconductor device in accordance with some embodiments. In FIG. 3, a semiconductor device 200 may have a cross sectional structure similar to the cross sectional structure of the semiconductor device 100 shown in FIG. 2. The semiconductor device 200 may include a first transistor 210 and a second transistor 220, and the first transistor 210 and the second transistor 220 may be disposed on a common substrate 202. The materials and the details of the substrate 202 are similar to the substrate 102 described in the previous embodiment and are not reiterated here.

The first transistor 210 may include a first semiconductor fin 212 and a first gate structure 214 over the first semiconductor fin 212. In some embodiments, the first transistor 210 may have a top view structure similar to the top view structure of the first transistor 110 shown in FIG. 1 and further include the source and the drain positioned at two opposite sides of the first gate structure 214. The first semiconductor fin 212 may be similar to the first semiconductor fin 112 in structure and formed on the substrate 202. The first semiconductor fin 212 may have two doped regions 212A and a channel region 212B between the two doped regions 212A. The first gate structure 214 is disposed over the channel region 212B and positioned between the two doped regions 212A. In some embodiments, the first transistor 210 may further include a spacer 210S disposed on the first semiconductor fin 212. The spacer 210S and the first semiconductor fin 212 may define a recess structure in the cross section above the channel region 212B, and the first gate structure 214 is disposed in the recess structure with an insulating layer 210I disposed between the first gate structure 214 and the first semiconductor fin 212. The materials and the details of the first semiconductor fin 212, the spacer 210S and the insulating layer 210I are similar to the first semiconductor fin 112, the spacer 110S and the insulating layer 110I described in the previous embodiment and are not reiterated here.

The first gate structure 214 may include a first high-k layer 214A and a sequentially disposed on the first semiconductor fin 212, while an insulating layer 210I may be disposed between the first gate structure 214 and the first semiconductor fin 212. A material of the first work function layer 214B may include metal carbide and aluminum, and a content of aluminum in the first work function layer 214B may be less than 10% atm. In addition, the first gate structure 214 may further include a first glue layer 214C and a first gate fill material 214D. The first gate fill material 214D is disposed on the first work function layer 214B and the first glue layer 214C is disposed between the first gate fill material 214D and the first work function layer 214B. The first high-k layer 214A, the first glue layer 214C and the first gate fill material 214D are similar to the first high-k layer 114A, the first glue layer 114C and the first gate fill material 114D described in the previous embodiment, and the materials and the details thereof are not reiterated here.

The second transistor 220 may have a structure similar to the first transistor 210. The second transistor 220 may include a second semiconductor fin 222 and a second gate structure 224 over the second semiconductor fin 222. The second semiconductor fin 222 may have two doped regions 222A and a channel region 222B between the two doped regions 222A. The second gate structure 224 is disposed over the channel region 222B, and positioned between the two doped regions 222A. In some embodiments, the second transistor 220 may further include a spacer 220S disposed on the second semiconductor fin 222. The second gate structure 224 may be surrounded by the spacer 220S and include a second high-k layer 224A and a second work function layer 224B sequentially disposed on the second semiconductor fin 222, while an insulating layer 220I may be disposed between the second gate structure 224 and the second semiconductor fin 222. The second gate structure 224 may further include a second glue layer 224C and a second gate fill material 224D. The second glue layer 224C is disposed between the second gate fill material 224D and the second work function layer 224B. A material of the second work function layer 224B may include metal carbide and aluminum, and a content of aluminum in the second work function layer 224B is less than 10% atm. The material of the first work function layer 214B may be similar to the material of the second work function layer 224B, but the thickness of the second work function layer 224B may be different from the thickness of the first work function layer 214B. In addition, the threshold voltage of the first transistor 210 may be different from the threshold voltage of the second transistor 220.

In some embodiments, the materials and the manufacturing methods of the spacers 210S and 220S, the insulating layers 210I and 220I, the first high-k layer 214A, the second high-k layer 224A, the first glue layer 214C, the second glue layer 224C, the first gate fill material 214D and the second gate fill material 224D may refer to the descriptions for the spacers 110S and 120S, the insulating layers 110I and 120I, the first high-k layer 114A, the second high-k layer 124A, the first glue layer 114C, the second glue layer 124C, the first gate fill material 114D and the second gate fill material 124D.

In some embodiments, the first high-k layer 214A, the first work function layer 214B, and the first glue layer 214C may conformally cover the recess structure defined by the spacer 210S and the first semiconductor fin 212, and the first gate fill material 214D fills the recess structure of the first glue layer 214C. Similarly, the second high-k layer 224A, the second work function layer 224B, and the second glue layer 224C may conformally cover the recess structure defined by the spacer 220S and the second semiconductor fin 222, and the second gate fill material 224D fills the recess structure of the second glue layer 224C. In addition, the first high-k layer 214A and the second high-k layer 224A may be formed by a common high-k layer with a high-k material such as hafnium oxide, tantalum oxide, zirconium oxide, titanium oxide, or aluminum oxide. The first glue layer 214C and the second glue layer 224C may be formed by a common glue layer with a material such as TiN. The first gate fill material 214D and the second gate fill material 224D may be formed of a common gate fill material such as Co, Ru, Al, W, combinations thereof, or multi-layers thereof.

The first work function layer 214B and the second work function layer 224B may be made of the same or similar material, but have different thicknesses. In some embodiments, a first common work function layer may be formed on the common high-k layer forming the first high-k layer 214A and the second high-k layer 224A by, for example, ALD depositing process. During the ALD depositing process, a first precursor and a second precursor are supplied into the ALD depositing chamber. In some embodiments, the first precursor may be $TiCl_4$ and the second precursor may be TMA. The deposited first common work function layer may be made of TiC and may also include additional material such as at least one of Al, C, and O. The content of Al in the first common work function layer may be less than 10% atm. Next, a second common work function layer may be formed on the first common work function layer by using the same or similar process of forming the first common work function layer. The second common work function layer may have the same or similar material to the first common work function layer. Subsequently, a portion of the second common work layer is removed to form the first work function layer 214B and another portion of the second common work function layer with the underlying first common work function layer may form the second work function layer 224B. The thickness of the first work function layer 214B is smaller than the thickness of the second work function layer 224B.

In some alternative embodiments, a mask (not shown) may be formed on the common high-k layer to cover a portion of the first common work function layer that is predetermined to form the first high-k layer 214A. The second common work function layer may be partially formed on the first common work function layer and partially formed on the mask. The mask may be removed after the formation of the second common work function layer and a portion of the second common work function layer covering the mask may be simultaneously removed, such that a portion of the first common work function layer is not covered by the second common work function layer to form the first work function layer 214B and another portion of the first common work function layer is covered by the second common work function layer such that the stacking of the first common work function layer and the second common work function layer forms the second work function layer 224B. As such, the first work function layer 214B and the second work function layer 224B may be different in thickness.

The common glue layer for forming the first glue layer 214C and the second glue layer 224C is formed to cover the first common work function layer and the second common work function layer in a conformal manner so that the common glue layer may define recess structures corresponding to the spacer 210S and the spacer 220S. The common gate fill material may fill the recess structures of the common glue layer. Subsequently, a planarization process such as chemical mechanical polishing (CMP) process may be performed to remove extra material to form the first gate structure 214 and the second gate structure 224 with the first work function layer 214B having different thicknesses from the second work function layer 224B.

Figure 4:
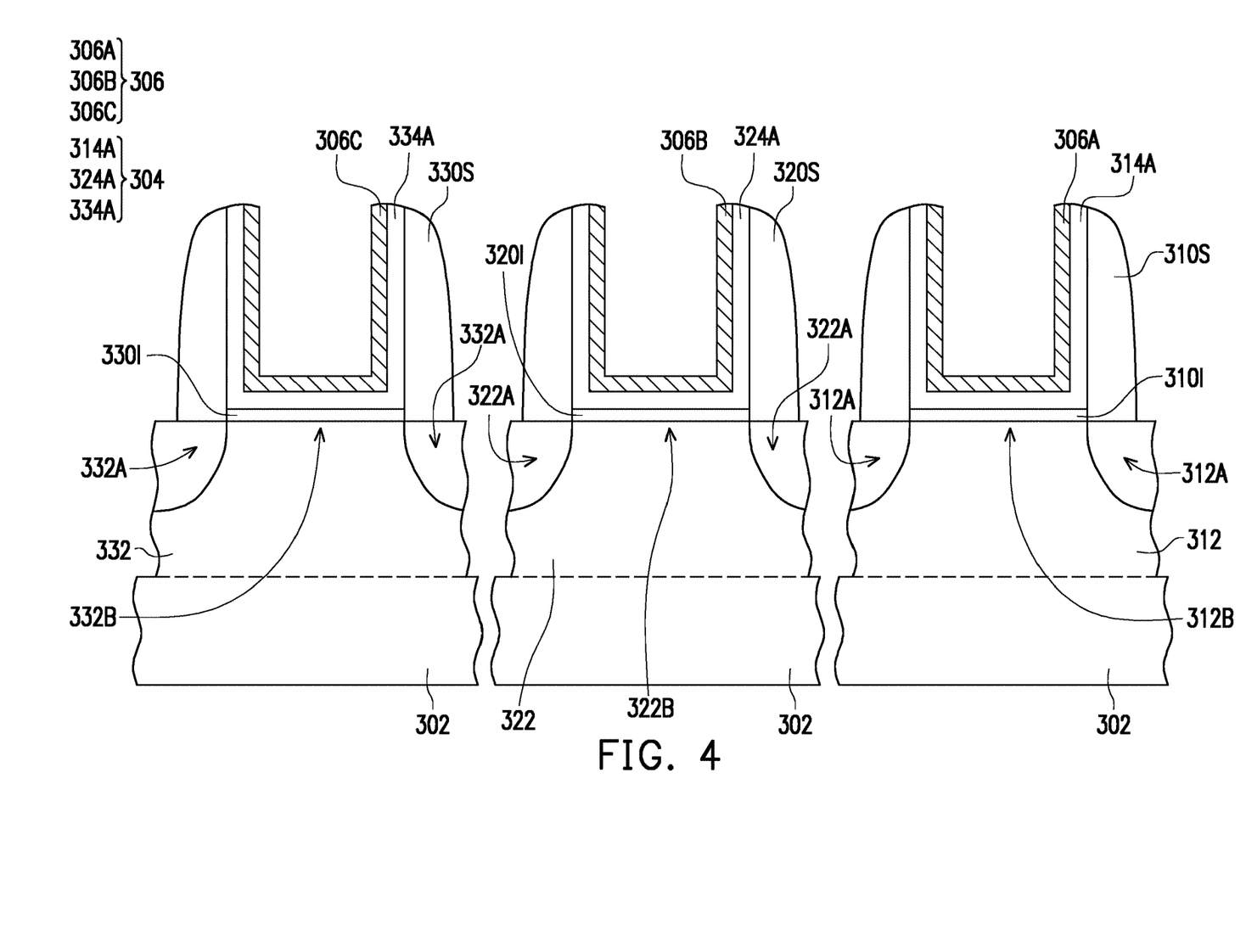
FIGS. 4-10 schematically illustrate a method of fabricating a semiconductor device in accordance with some embodiments.

FIGS. 4-10 schematically illustrate a method of fabricating a semiconductor device in accordance with some embodiments. In FIG. 4, semiconductor fins 312, 322, and 332 are formed on a substrate 302. Each of the semiconductor fins 312, 322, and 332 may have a linear structure in the top view, which is similar to the top view structures of the first and second semiconductor fins 112 and 122 shown in FIG. 1. The semiconductor fin 312 may have two doped regions 312A separated by a channel region 312B, the semiconductor fin 322 may have two doped regions 322A separated by a channel region 322B, and the semiconductor fin 332 may have two doped regions 332A separated by a channel region 332B. An insulating layer 310I may be formed on the channel region 312B of the semiconductor fin 312, an insulating layer 320I may be formed on the channel region 322B of the semiconductor fin 322, and an insulating layer 330I may be formed on the channel region 332B of the semiconductor fin 332. In some embodiments, a spacer 310S may be formed on the semiconductor fin 312 to form a recess structure over the semiconductor fin 312, a spacer 320S may be formed on the semiconductor fin 322 to form a recess structure over the semiconductor fin 322, and a spacer 330S may be formed on the semiconductor fin 332 to form a recess structure over the semiconductor fin 332.

A common high-k layer 304 is formed on the substrate 302 by using physical vapor deposition (PVD), atomic layer deposition (ALD), chemical vapor deposition (CVD), sputtering, or other known processes. The common high-k layer 304 may have a dielectric constant greater than, for example, about 3.9 (the dielectric constant of silicon dioxide) or about 7.0, and include, but not limited to, one or more of hafnium oxide, tantalum oxide, zirconium oxide, titanium oxide, or aluminum oxide. A portion of the common high-k layer 304 covers the recess structure of the spacer 310S in a conformed manner to serve as a high-k layer 314A, a portion of the common high-k layer 304 covers the recess structure of the spacer 320S in a conformed manner to serve as a high-k layer 324A, and a portion of the common high-k layer 304 covers the recess structure of the spacer 330S in a conformed manner to serve as a high-k layer 334A.

Next, a common work function layer 306 is formed on the common high-k layer 304. The common work function layer 306 may be formed by depositing a material of the work function layer on the common high-k layer 304 by using a first precursor and a second precursor. In some embodiments, the first precursor may include metal chloride, and the second precursor may include tri-methyl-aluminum (TMA). In some examples, the first precursor may be $TiCl_4$, and the deposited common work function layer 306 may be made of TiC. In some alternative embodiments, the material of the common work function layer 306 may further include at least one of Al, Cl, and O. In the common work function layer 306, aluminum is with a content of less than 10% atm. The common work function layer 306 may include a first portion 306A covering the high-k layer 314A, a second portion 306B covering the high-k layer 324A and a third portion 306C covering the high-k layer 334A. In some embodiments, one or more capping layer (not shown) may be formed on the common high-k layer 304 prior to the formation of the common work function layer 306. In some examples, the cap layer may be or include titanium nitride (TiN) or tantalum nitride (TaN) to protect the common high-k layer 304 from damage during the subsequent process.

Figure 5:
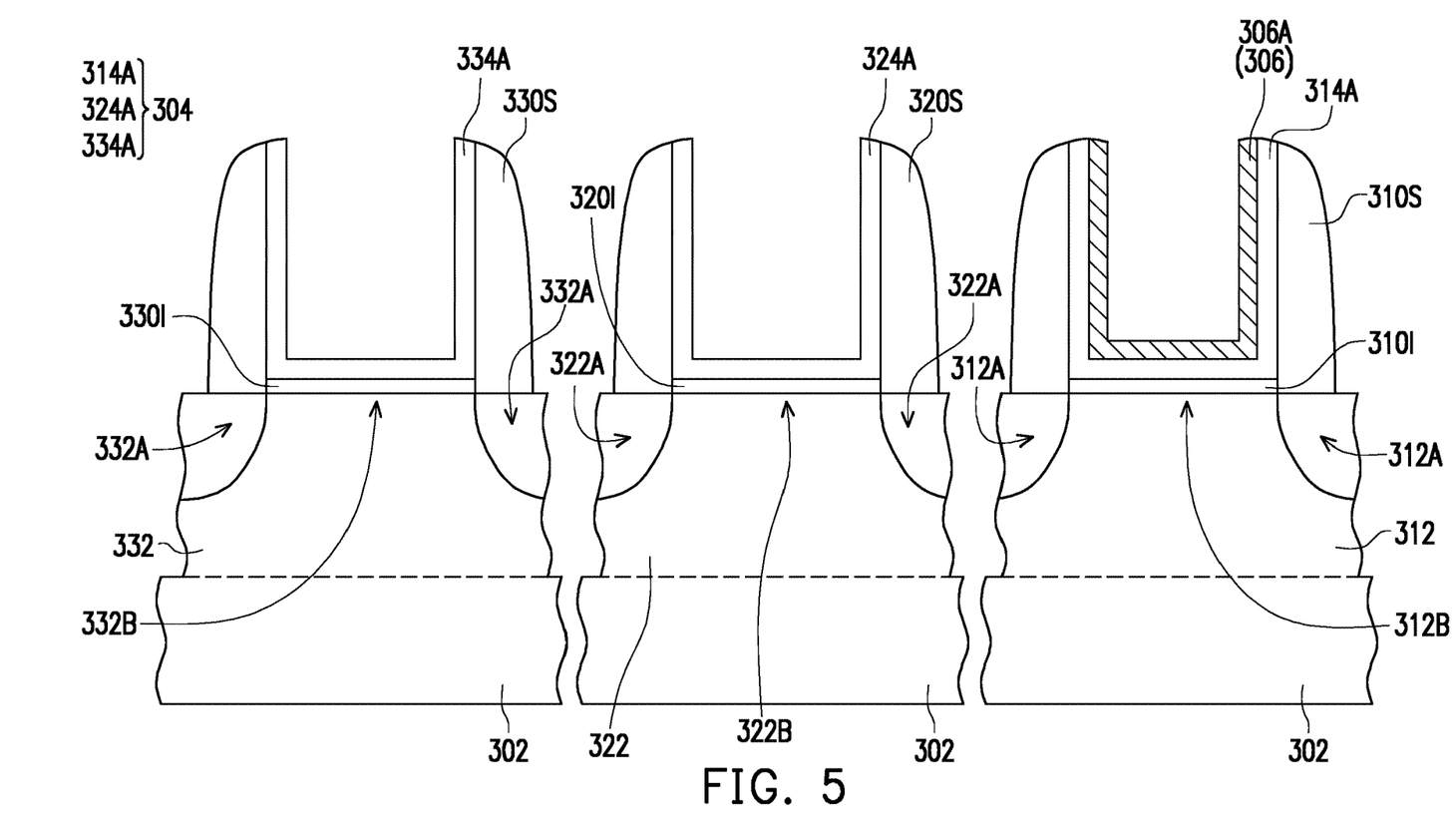

Referring to FIG. 4 and FIG. 5 together, the common work function layer 306 may be patterned by removing the second portion 306B covering the high-k layer 324A and the third portion 306C covering the high-k layer 334A. The first portion 306A remains on the high-k layer 314A. In some embodiments, one or more capping layer may be formed between the high-k layer 324A and the common work function layer 306 and between the high-k layer 334A and the common work function layer 306 so that the damage of the high-k layer 324A and the high-k layer 334A due to the patterning process of the common work function layer 306 may be prevented. In some alternative embodiments, the etchant used for patterning the common work function layer 306 may have a good selectivity between the common work function layer 306 and the common high-k layer 304 so as to prevent the common high-k layer 304 from unintentional damage.

Figure 6:
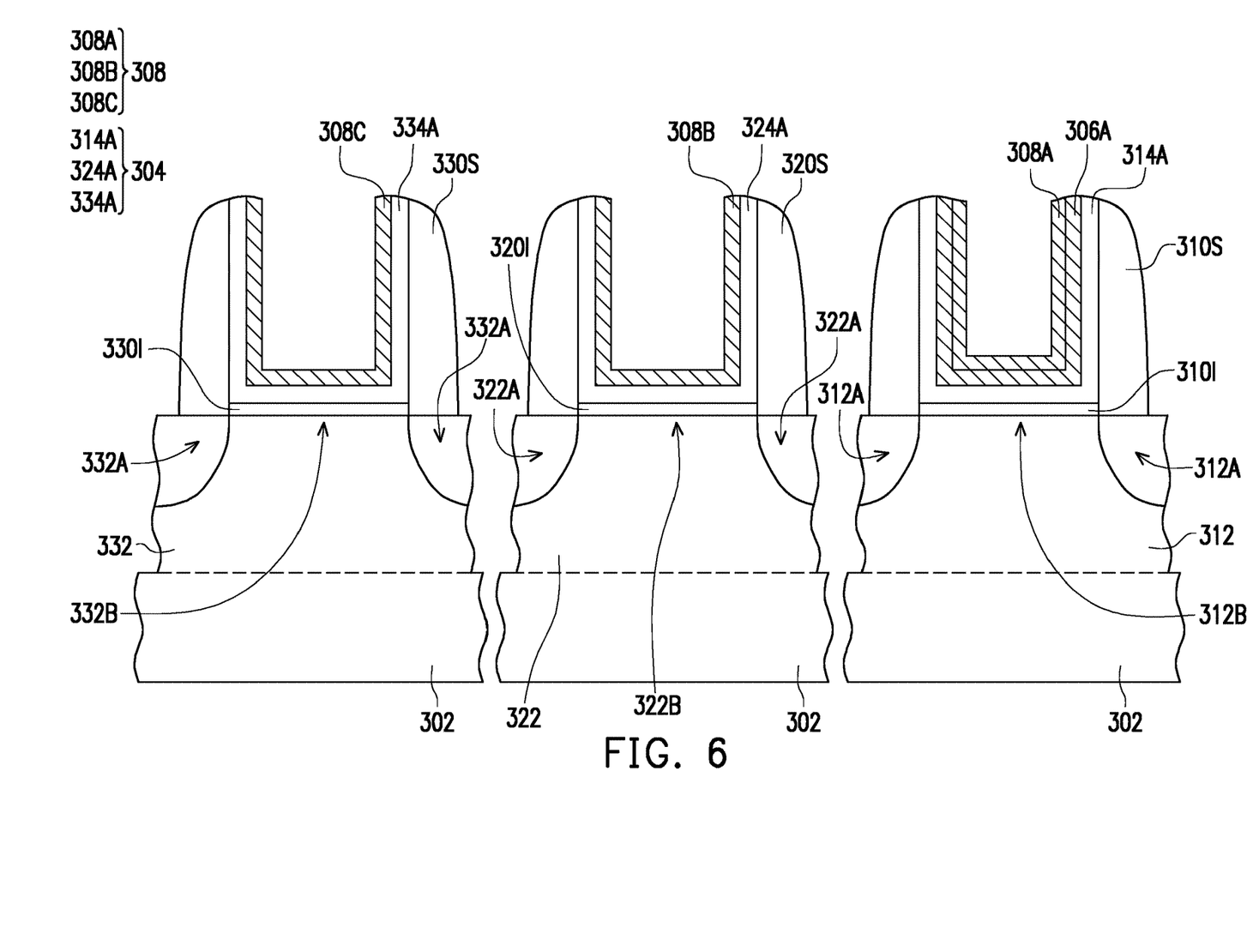

Referring to FIG. 6, another common work function layer 308 is formed on the substrate 302. In some embodiments, the common work function layer 308 may be formed by using the same or similar method of forming the common work function layer 306. The material of the common work function layer 308 may include TiC. The material of the common work function layer 308 may further include Al, O, Cl, etc., while a content of Al in the common work function layer 308 may be less than 10% atm. The common work function layer 308 includes a first portion 308A covering the remained first portion 306A of the previously formed common work function layer 306 over the high-k layer 314A, a second portion 308B covering the high-k layer 324A and a third portion 308C covering the high-k layer 334A.

Figure 7:
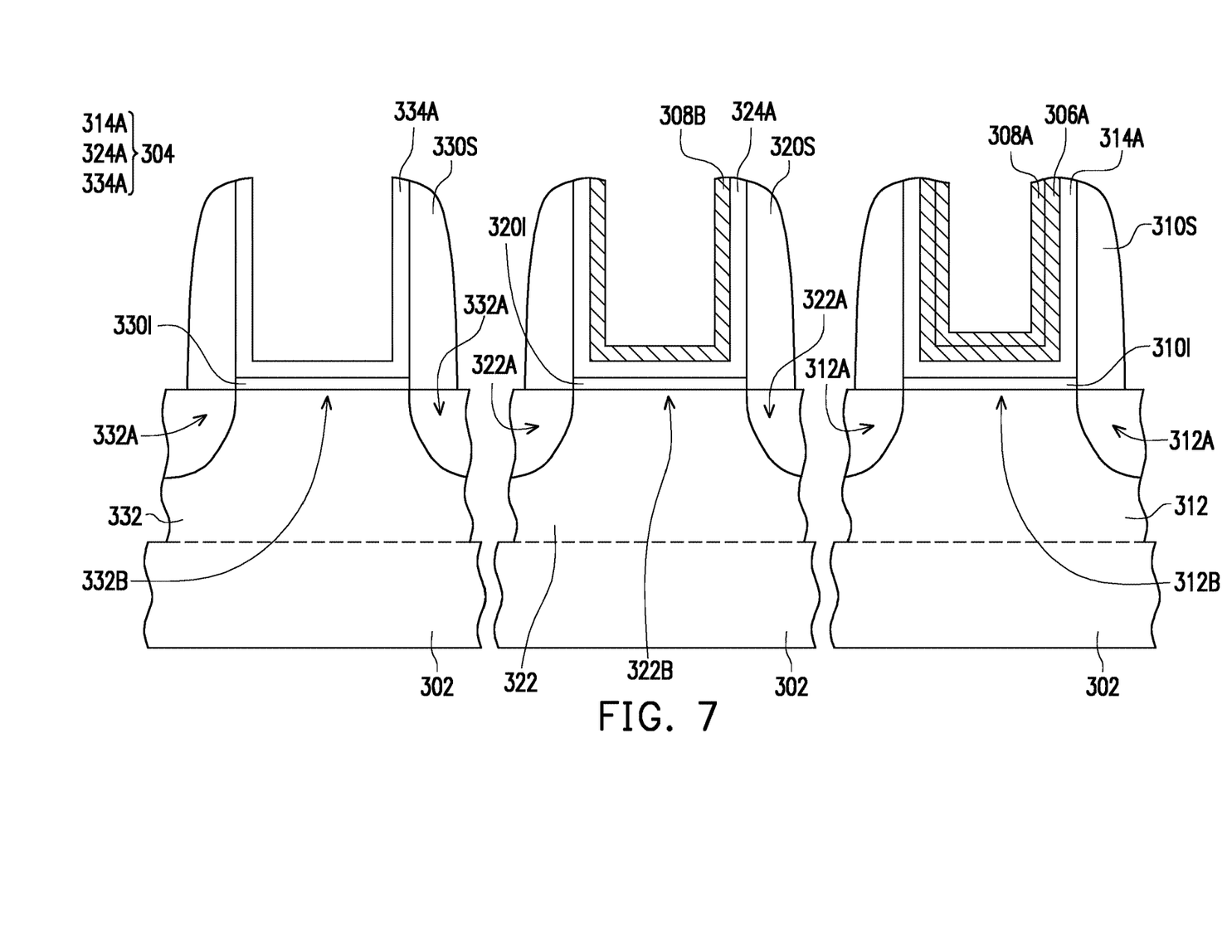

Referring FIG. 6 and FIG. 7 together, the common work function layer 308 may be patterned by removing the third portion 308C. The first portion 308A of the common work function layer 308 may remain on the first portion 306A over the high-k layer 314A, and the second portion 308B may remain on the high-k layer 324A. In some embodiments, one or more capping layer may be formed between the high-k layer 334A and the common work function layer 308 so that the damage of the high-k layer 334A due to the patterning process of the common work function layer 308 may be prevented. In some alternative embodiments, the etchant used for patterning the common work function layer 308 may have a good selectivity between the common work function layer 308 and the high-k layer 334A so as to prevent the high-k layer 334A from unintentional damage.

Figure 8:
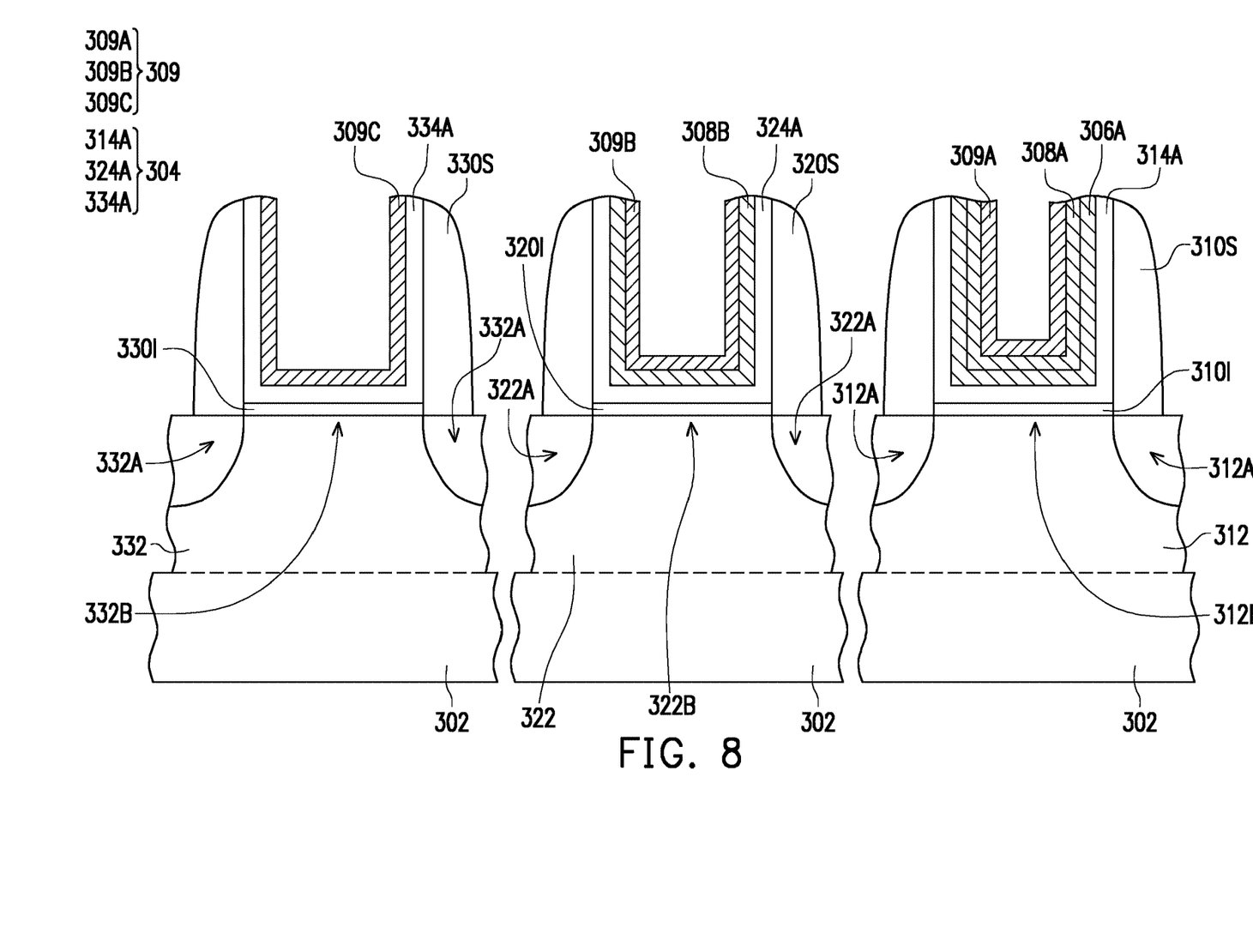

Referring to FIG. 8, a further common work function layer 309 may be formed on the substrate 302 by physical vapor deposition (PVD), atomic layer deposition (ALD), chemical vapor deposition (CVD), sputtering, or other known processes. The further common work function layer 309 may be made of metal or metal carbide. In some embodiments, the material of the common work function layer 309 may include at least one selected from TiAl, TiAlC, TaC, TaAlC, NbC, and VC. The common work function layer 309 may include Al with a content of more than 10% atm. The previously formed common work function layers 306 and 308 may have a work function greater than the common work function layer 309. In some embodiments, the common work function layers 306 and 308 may have a characteristic similar to p-type work function layer and the common work function layer 309 may have a characteristic similar to n-type work function layer, but is not limited thereto.

Figure 9:
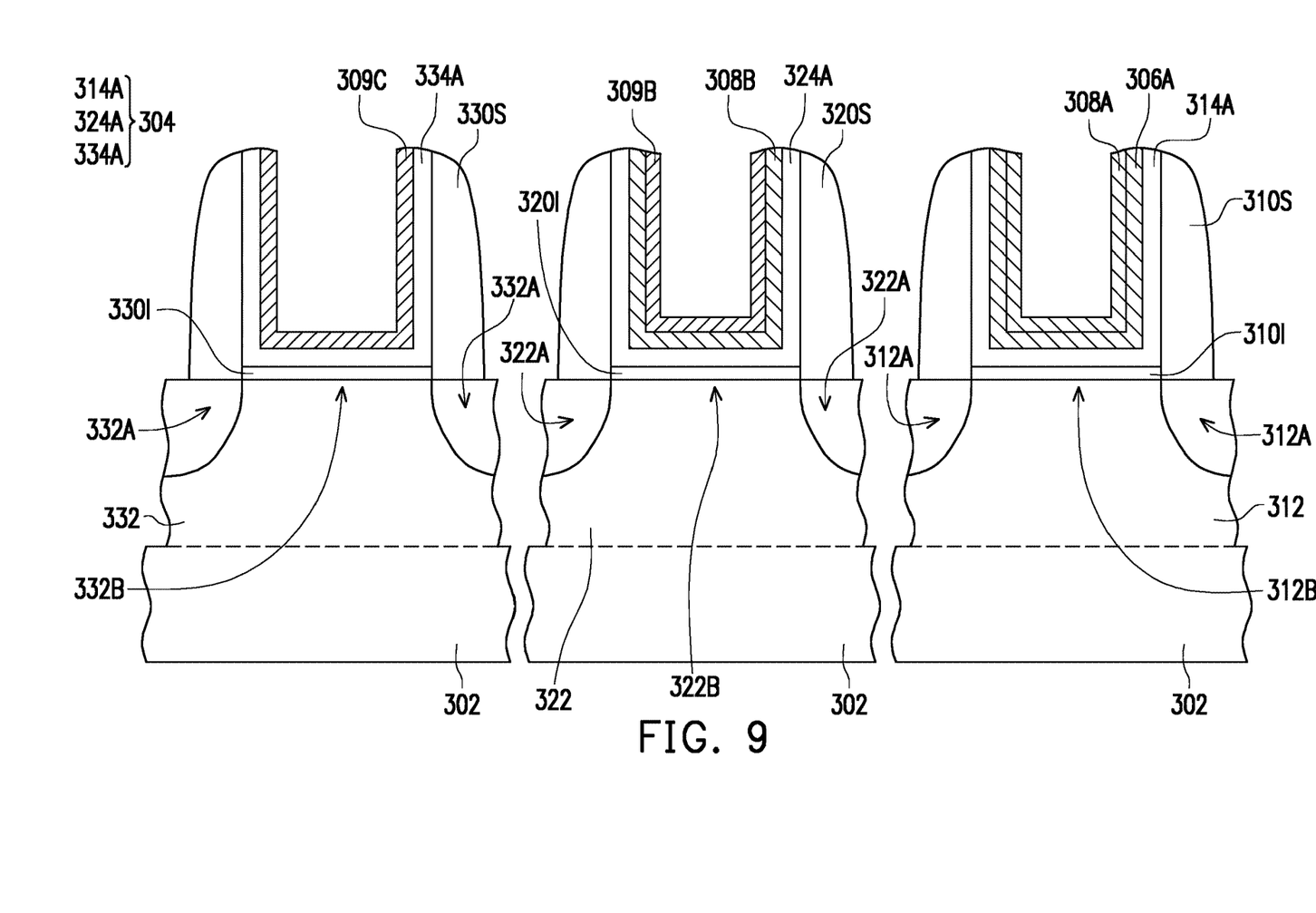

Referring FIG. 8 and FIG. 9 together, the common work function layer 309 may be patterned by removing the first portion 309A covering the first portion 308A of the common work function layer 308. The second portion 309B may remain on the second portion 308B of the common work function layer 308. The third portion 309C of the common work function layer 309 may remain on the high-k layer 334A.

Figure 10:
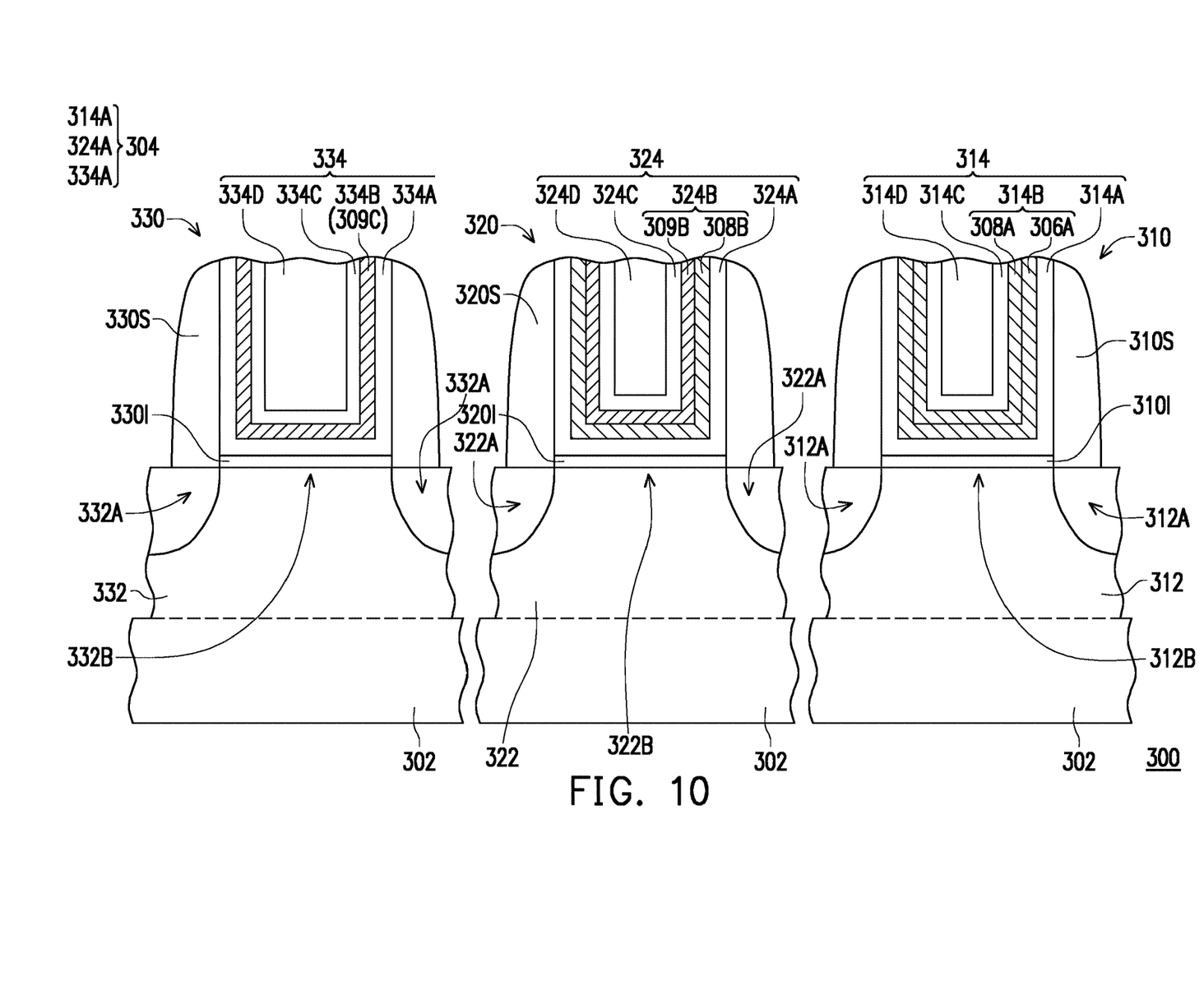

Referring to FIG. 9 and FIG. 10, a common glue layer and a common gate fill material are then sequentially formed on the substrate 302. The common glue layer may include a glue layer 314C covering the first portion 308A of the common work function layer 308, a glue layer 324C covering the second portion 309B of the common work function layer 309, and a glue layer 334C covering the third portion 309C of the common work function layer 309. The glue layer 314C, the glue layer 324C and the glue layer 334C may be formed to define recess structures corresponding to the spaces 310S, 320S and 330S, respectively. The common gate fill material may include a gate fill material 314D filling the recess structure defined by the glue layer 314C, a gate fill material 324D filling the recess structure defined by the glue layer 324C, and a gate fill material 334D filling the recess structure defined by the glue layer 334C. Subsequently, a planarization process such as chemical mechanical polishing (CMP) process may be performed to remove extra material to form individual gate structures 314, 324 and 334.

The first portion 306A of the common work function layer 306 and the first portion 308A of the common work function layer 308 may respectively serve as a first sub layer and a second sub layer of a work function layer 314B. The gate structure 314 may include the high-k layer 314A, the work function layer 314B, the glue layer 314C and the gate fill material 314D, wherein the high-k layer 314A, the work function layer 314B, the glue layer 314C and the gate fill material 314D may form a common top surface for contacting with another conductive material or another component. In the work function layer 314B, the material of the first sub layer (the first portion 306A of the common work function layer 306) and the material of the second sub layer (the first portion 308A of the common work function layer 308) may be of the same material. In some alternative embodiments, the first portion 308A of the common work function layer 308 may be removed and the work function layer 314B may only include the first portion 306A of the common work function layer 306.

The second portion 308B of the common work function layer 308 and the second portion 309B of the common work function layer 309 sequentially covering the high-k layer 324A may respectively serve as a first sub layer and a second sub layer of a work function layer 324B. The gate structure 324 may include the high-k layer 324A, the work function layer 324B, the glue layer 324C and the gate fill material 324D, wherein the high-k layer 324A, the work function layer 324B, the glue layer 324C and the gate fill material 324D may form a common top surface for contacting with another conductive material or another component. The work function layer 324B may include the first sub layer (the second portion 308B of the common work function layer 308) and the second sub layer (the second portion 309B of the common work function layer 309) made of different materials, and the first sub layer (the second portion 308B of the common work function layer 308) that is adjacent to the high-k layer 324A may be of the same material of the work function layer 314B.

The third portion 309C of the common work function layer 309 covering the high-k layer 334A forms a work function layer 334B. The gate structure 334 may include the high-k layer 334A, the work function layer 334B, the glue layer 334C and the gate fill material 334D, wherein the high-k layer 334A, the work function layer 334B, the glue layer 334C and the gate fill material 334D may form a common top surface for contacting with another conductive material or another component.

The gate structures 314, 324 and 334 respectively disposed over the semiconductor fins 312, 322 and 332 may construct transistors 310, 320 and 330 of a semiconductor device 300. The work function layer 314B and the first sub layer of the work function layer 324B may be made of the same or similar material. The transistor 310 and the transistor 320 may be the same type transistors but have different threshold voltages. In some embodiments, the work function of the work function layer 314B may be greater than the work function of the work function layer 324B. The work function layer 334B may have a material having different electricity characteristics from the work function layer 314B and the first sub layer of the work function layer 324B. The transistor 330 may be a different type transistor from the transistor 310 and the transistor 320. In some instances, the work functions of the work function layers 314B and 324B may be greater than the work function of the work function layer 334B. In some embodiments, the transistor 310 and the transistor 320 may be p-type transistors and the transistor 330 may be n-type transistor. The transistor 320 may present a device characteristic intermediated between the transistor 310 and the transistor 330.

As discussed above, the semiconductor device may have multiple transistors with different device characteristics. The work function layer in one transistor may be different from the work function layer in another transistor, such that the two transistors may have different threshold voltages. In accordance with some embodiments, the work function layers in different transistors may be made by using the precursors such as $TiCl_4$ and TMA. The work function layers in different transistors may include similar or the same material, but have different thicknesses. As such, the transistors may be the same type transistors but have different threshold voltages. In some examples, the work function layer may be made of metal carbide with Al with a content less than 10% atm. The threshold voltage of the transistor having the work function layer may be adjustable by the thickness of the work function layer. Accordingly, multiple transistors with various device characteristics in the semiconductor device may be achieved.

In accordance with some embodiments of the disclosure, a semiconductor device includes a substrate, a first transistor and a second transistor. The first transistor is disposed on the substrate, and includes a first semiconductor fin and a first gate structure over the first semiconductor fin. The first gate structure includes a first high-k layer and a first work function layer sequentially disposed on the first semiconductor fin, a material of the first work function layer may include metal carbide and aluminum, and a content of aluminum in the first work function layer is less than 10% atm. The second transistor is disposed on the substrate, and includes a second semiconductor fin and a second gate structure over the second semiconductor fin. The second gate structure includes a second high-k layer and a second work function layer sequentially disposed on the second semiconductor fin. A work function of the first work function layer is greater than a work function of the second work function layer.

In accordance with some embodiments of the disclosure, a semiconductor device includes a substrate and a first transistor. The first transistor may be disposed on the substrate, and include a first semiconductor fin and a first gate structure over the first semiconductor fin. The first gate structure may include a first high-k layer and a first work function layer sequentially disposed on the first semiconductor fin, and a material of the first work function layer may include Ti, Al and C, wherein a content of aluminum in the first work function layer is less than 10% atm.

In accordance with some embodiments of the disclosure, a method of fabricating a semiconductor device includes: forming a semiconductor fin on a substrate; forming a high-k layer on the semiconductor fin; and forming a work function layer on the high-k layer, wherein the forming the work function layer may include depositing a material of the work function layer on the high-k layer by using a first precursor and a second precursor, the first precursor includes metal chloride, the second precursor includes tri-methyl-aluminum.

In accordance with some embodiments of the disclosure, the metal carbide may include titanium carbide. The material of the first work function layer may further include at least one selected from O, and Cl. A thickness of the second work function layer may be different from a thickness of the first work function layer. A material of the second work function layer may include aluminum with a content of more than 10% atm. The first gate structure may further include a first gate fill material disposed on the first work function layer, and the second gate structure may further include a second gate fill material disposed on the second work function layer. The first high-k layer and the second high-k layer may be of the same material. A third transistor may be further disposed on the substrate, and include a third semiconductor fin and a third gate structure over the third semiconductor fin. The third gate structure may include a third high-k layer and a third work function layer sequentially disposed on the third semiconductor fin. A material of the third work function layer is different from the material of the first work function layer. The second work function layer of the second gate structure may include a first sub layer and a second sub layer sequentially disposed on the second high-k layer, a material of the first sub layer is the same as the first work function layer, and a material of the second sub layer is different from the first work function layer.

In accordance with some embodiments of the disclosure, the material of the first work function layer may further include at least one selected from O and Cl. The first gate structure may further include a first gate fill material disposed on the first work function layer. A second transistor may be further disposed on the substrate, and include a second semiconductor fin and a second gate structure over the second semiconductor fin. The second gate structure may include a second high-k layer and a second work function layer sequentially disposed on the second semiconductor fin. The material of the second work function layer may include aluminum with a content of more than 10% atm. The second gate structure may further include a second gate fill material disposed on the second work function layer. The first high-k layer and the second high-k layer are of the same material. A third transistor may be further disposed on the substrate, and include a third semiconductor fin and a third gate structure over the third semiconductor fin. The third gate structure may include a third high-k layer and a third work function layer sequentially disposed on the third semiconductor fin. The second work function layer of the second gate structure may include a first sub layer and a second sub layer sequentially disposed on the second high-k layer. The first sub layer may include a material the same as the first work function and the second sub layer may include a material the same as the third work function layer.

In accordance with some embodiments of the disclosure, the metal chloride may include $TiCl_4$ and the metal carbide may include TiC. The material of the work function layer may further include aluminum with a content of less than 10% atm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first P-type transistor comprising a first high-k layer, a first bottom work function layer and a first upper work function layer, the first bottom work function being in contact with the first high-k layer and interposed between the first high-k layer and the first upper work function layer, wherein a material of the first bottom work function layer comprises metal carbide and aluminum, and a content of aluminum in the first bottom work function layer is less than 10% atm; and a second P-type transistor located at a side of the first P-type transistor comprising a second high-k layer, a second bottom work function layer and a second upper work function layer, the second bottom work function layer being in contact with the second high-k layer and interposed between the second high-k layer and the second upper work function layer, wherein a material of the second bottom work function layer is the same as a material of the first bottom work function layer, the material of the second upper work function layer is different from a material of the first upper work function layer and a material of the second upper work function layer comprises aluminum of a content more than 10% atm.

2. The semiconductor device of claim 1, wherein the metal carbide comprises titanium carbide.

3. The semiconductor device of claim 1, wherein the material of the first bottom work function layer further comprises at least one selected from O and Cl.

4. The semiconductor device of claim 1, wherein the material of the first upper work function layer is the same as the second bottom work function layer.

5. The semiconductor device of claim 1, wherein a material of the second upper work function layer comprises TiAl, TiAlC, TaC, TaAlC, NbC, and VC.

6. The semiconductor device of claim 1, wherein the first P-type transistor further comprises a first gate fill material disposed on the first upper work function layer, and the second P-type transistor further comprises a second gate fill material disposed on the second upper work function layer.

7. The semiconductor device of claim 6, wherein the first P-type transistor further comprises a first glue layer disposed between the first upper work function layer and the first gate fill material, and the second P-type transistor further comprises a second glue layer disposed between the second upper work function layer and the second gate fill material.

8. The semiconductor device of claim 1, further comprising:

an N-type transistor disposed located at a side of the second P-type transistor, wherein the N-type transistor comprises a third high-k layer and a third work function layer disposed on the third high-k layer.

9. The semiconductor device of claim 8, wherein a material of the third work function layer is the same as the material of the second upper work function layer.

10. The semiconductor device of claim 8, wherein the third work function layer is in contact with the third high-K layer.

11. A semiconductor device comprising:

a first transistor comprising a first high-k layer, and a first work function layer disposed on the first high-k layer, the first work function layer comprising a first upper work function layer and a first bottom work function layer interposed between the first upper work function layer and the first high-k layer;

a second transistor comprising a second high-k layer, and a second work function layer disposed on the second high-k layer, the second work function layer comprising a second upper work function layer and a second bottom work function layer interposed between the second upper work function layer and the second high-k layer, wherein a material of the second upper work function layer is the same as the first bottom work function layer; and a third transistor comprising a third high-k layer, and a third work function layer in contact with the third high-k layer, wherein a material of the third work function layer is the same as the first upper work function layer.

12. The semiconductor device of claim 11, wherein the material of the first bottom work function layer comprises aluminum of a content less than 10% atm.

13. The semiconductor device of claim 11, wherein the material of the first upper work function layer comprises aluminum of a content greater than 10% atm.

14. The semiconductor device of claim 11, wherein the material of the first bottom work function layer comprises TiC.

15. The semiconductor device of claim 11, wherein the material of the second bottom work function layer comprises TiC.

16. The semiconductor device of claim 11, wherein the material of the second bottom work function layer comprises aluminum of a content less than 10% atm.

17. The semiconductor device of claim 11, wherein the first bottom work function layer is in contact with the high-k layer and the second bottom work function layer is in contact with the high-k layer.

18. A method of fabricating a semiconductor device, comprising:

forming a first P-type transistor comprising a first high-k layer, a first bottom work function layer and a first upper work function layer, the first bottom work function layer being in contact with the first high-k layer and interposed between the first high-k layer and the first upper work function layer, wherein a material of the first bottom work function layer comprises metal carbide and aluminum, a content of aluminum in the first bottom work function layer is less than 10% atm and a material of the first upper work function layer comprises aluminum of a content greater than 10% atm; and forming a second P-type transistor located at a side of the first P-type transistor, the second P-type transistor comprising a second high-k layer, a second bottom work function layer and a second upper work function layer, the second bottom work function being in contact with the second high-k layer and interposed between the second high-k layer and the second upper work fundtion layer, wherein a material of the second bottom work function layer is the same as a material of the first bottom work function layer, the material of the second upper work function layer is different from a material of the first upper work function layer and a material of the second upper work function layer comprises aluminum of a content more than 10% atm, wherein a formation of the first bottom work function layer comprises:

depositing the material of the first bottom work function layer on the first high-k layer by using a first precursor and a second precursor, wherein the first precursor comprises metal chloride, and the second precursor comprises tri-methyl-aluminum.

19. The method of claim 18, wherein the metal chloride comprises TiCl4.

20. The method of claim 18, wherein the depositing comprises an atomic layer deposition.

\* \* \* \* \*